(12) United States Patent
Boudiaf et al.

(10) Patent No.: US 9,964,580 B2
(45) Date of Patent: May 8, 2018

(54) SOLID STATE IMPEDANCE TUNERS

(71) Applicant: Maury Microwave, Inc., Ontario, CA (US)

(72) Inventors: Ali Boudiaf, Sierra Madre, CA (US); Roman Meierer, Lachine (CA); Gary R. Simpson, Fontana, CA (US)

(73) Assignee: Maury Microwave, Inc., Ontario, CA (US)

( * ) Notice: Subject to any disclaimer, the term of this patent is extended or adjusted under 35 U.S.C. 154(b) by 3 days.

(21) Appl. No.: 15/595,769

(22) Filed: May 15, 2017

(65) Prior Publication Data

US 2017/0285085 A1   Oct. 5, 2017

Related U.S. Application Data

(63) Continuation of application No. 14/284,862, filed on May 22, 2014, now Pat. No. 9,660,607.

(60) Provisional application No. 61/829,997, filed on May 31, 2013.

(51) Int. Cl.
| | |
|---|---|
| *G01R 27/32* | (2006.01) |
| *G01R 31/02* | (2006.01) |
| *H03H 11/28* | (2006.01) |
| *G01R 1/00* | (2006.01) |
| *H03H 1/00* | (2006.01) |

(52) U.S. Cl.
CPC .............. *G01R 31/02* (2013.01); *H03H 11/28* (2013.01); *G01R 1/00* (2013.01); *H03H 1/00* (2013.01); *H04B 2201/00* (2013.01)

(58) Field of Classification Search
CPC ... G01R 1/00; H01P 1/00; H03H 1/00; H03H 2210/00; H03J 1/00; H03J 2200/00; H04B 1/00; H04B 2201/00
See application file for complete search history.

(56) References Cited

U.S. PATENT DOCUMENTS

| | | | | |
|---|---|---|---|---|
| 9,041,498 B1* | 5/2015 | Tsironis | ................. | G01R 27/32 333/17.3 |
| 2001/0024117 A1* | 9/2001 | Kiyokawa | .......... | G01R 31/2603 324/76.49 |
| 2006/0116857 A1* | 6/2006 | Sevic | .................. | G06F 17/5036 703/13 |
| 2010/0030504 A1* | 2/2010 | Simpson | ................ | G01R 29/26 702/69 |
| 2014/0103946 A1* | 4/2014 | Vanden Bossche | ............. | G01R 31/2822 324/750.01 |

* cited by examiner

*Primary Examiner* — Jermele M Hollington
*Assistant Examiner* — Temilade Rhodes-Vivour
(74) *Attorney, Agent, or Firm* — Larry K. Roberts

(57) ABSTRACT

A solid state impedance tuner or impedance tuner system including a housing structure and at least two solid state tuner modules electrically combined and disposed in one package within the housing structure. Each tuner module includes at least one solid state control element.

Another embodiment is directed to an impedance tuner module card configured in a standardized system architecture. The card includes a chassis board, and at least one solid state tuner module integrated on the card and supported on or by the chassis board, each module including at least one solid state control element.

Methods for calibrating a solid state impedance tuner that includes at least two solid state tuner modules combined in one package are disclosed.

15 Claims, 17 Drawing Sheets

SOLID STATE IMPEDANCE TUNERS

CROSS-REFERENCE TO RELATED APPLICATION

This application claims priority from non-provisional patent application Ser. No. 14/284,862, filed May 22, 2014, which in turn claims priority from provisional application No. 61/829,997, filed May 31, 2013, the entire contents of which applications are incorporated herein by this reference.

BACKGROUND

Impedance tuners are used to present impedances (also referred to as VSWR, gamma, reflection, return loss) to a device under test and measure its performance as a function of said impedance. Various forms of impedance tuners exist, including mechanical slide-screw tuners, which use a mechanical probe in conjunction with a slabline, and whose probe position dictates the resulting impedance. The probe's horizontal position in relation to the slabline usually affects the phase of the impedance presented to the Device under Test (DUT), whereas the probe's vertical position usually affects the magnitude of the impedance presented to the DUT. Because the probe can be moved in extremely small steps with high resolution, thousands, tens of thousands or even hundreds of thousands of impedance states can be generated at will. Advantages include high resolution, high point count, high power handling and wide frequency bandwidth. Disadvantages include tuning speed and size and weight.

Electronic impedance tuners utilize PIN diodes or switches, with fixed or swept bias voltages and currents, which result in a non-uniform low-density impedance grid. Examples of the electronic or solid state impedance tuners are described in U.S. Pat. Nos. 5,034,708 and 5,276,411, the entire contents of which patents are incorporated herein by this reference. Advantages of electronic or solid state tuners include high tuning speed and small size and weight. Disadvantages include low point density and low power handling.

It is important to note that high tuning speed and high point density are two of the primary requirements of an impedance tuner.

Passive load pull systems have been widely used to characterize microwave devices. Load pull systems measure a DUT under controlled conditions, including controlled impedances seen by the DUT. The controlled impedances may include the impedance on any port of the DUT, and a typical load pull measurement would measure the DUT performance at multiple impedances to show the effect of impedance on the DUT performance. Some other conditions that may be controlled and/or varied include frequency, power level, bias values, or temperature.

In this document, impedance, reflection, or reflection coefficient are all used as general terms to describe the RF termination seen at an RF port. They are functions of the signal coming out of an RF port and the signal at the same frequency coming into the port. Reflection coefficient is related to impedance by the expression $$Z = Z_0 \frac{(1+\Gamma)}{(1-\Gamma)},$$

where Z is the impedance and $\Gamma$ is reflection coefficient. Both terms contain the same information, so that if one is known, the other is also known. Therefore, in this document they will be used interchangeably.

Tuning resolution is a term that indicates how close the available impedances are to each other in the impedance or reflection plane. High resolution (or fine resolution) means that the gaps between available impedances are very small. Lower resolution means that the gaps between available impedances are larger.

Matching range is a term that indicates the maximum reflection that can be achieved by at tuner over a desired phase range. As an impedance tuner specification, this generally means for all or most reflection phase values (allowing for tuning resolution). However, this definition used for a tuner system can be modified to mean the maximum reflection over a limited phase range. For example, many power transistors require low impedances at the fundamental frequency, so a high matching range is only needed at the low impedance (left side) of the Smith chart.

Automated load pull systems have widely used mechanical tuners, although the size and slow speed is a limitation. Solid state tuners using PIN diodes as switching elements have also been used for load pull systems, and these may provide a big speed advantage, but they have limited tuning resolution.

BRIEF DESCRIPTION OF THE DRAWINGS

Features and advantages of the disclosure will readily be appreciated by persons skilled in the art from the following detailed description when read in conjunction with the drawing wherein.

DETAILED DESCRIPTION

Figure 1:
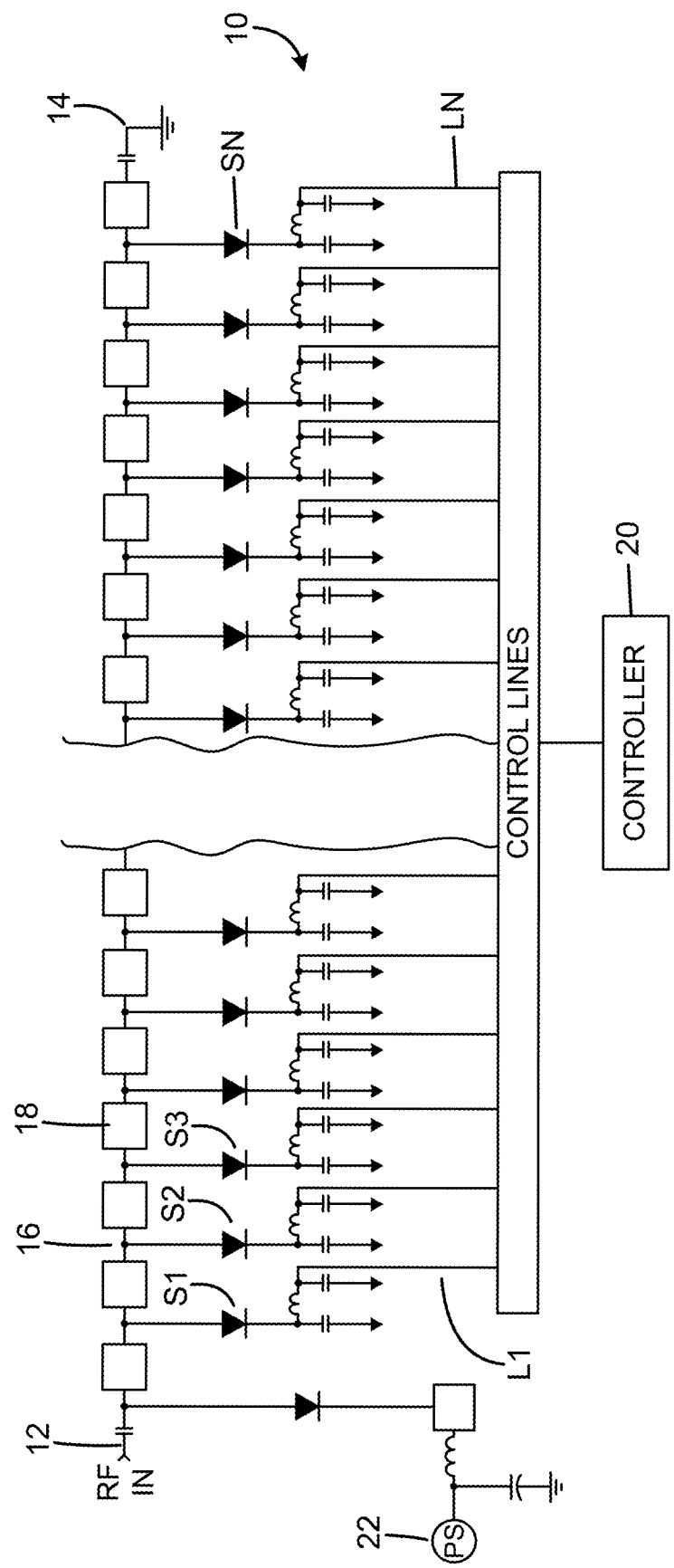
FIG. 1 is a schematic diagram showing an exemplary embodiment of a solid state control element array.

In the following detailed description and in the several figures of the drawing, like elements are identified with like reference numerals. The figures are not to scale, and relative feature sizes may be exaggerated for illustrative purposes.

Figure 2:
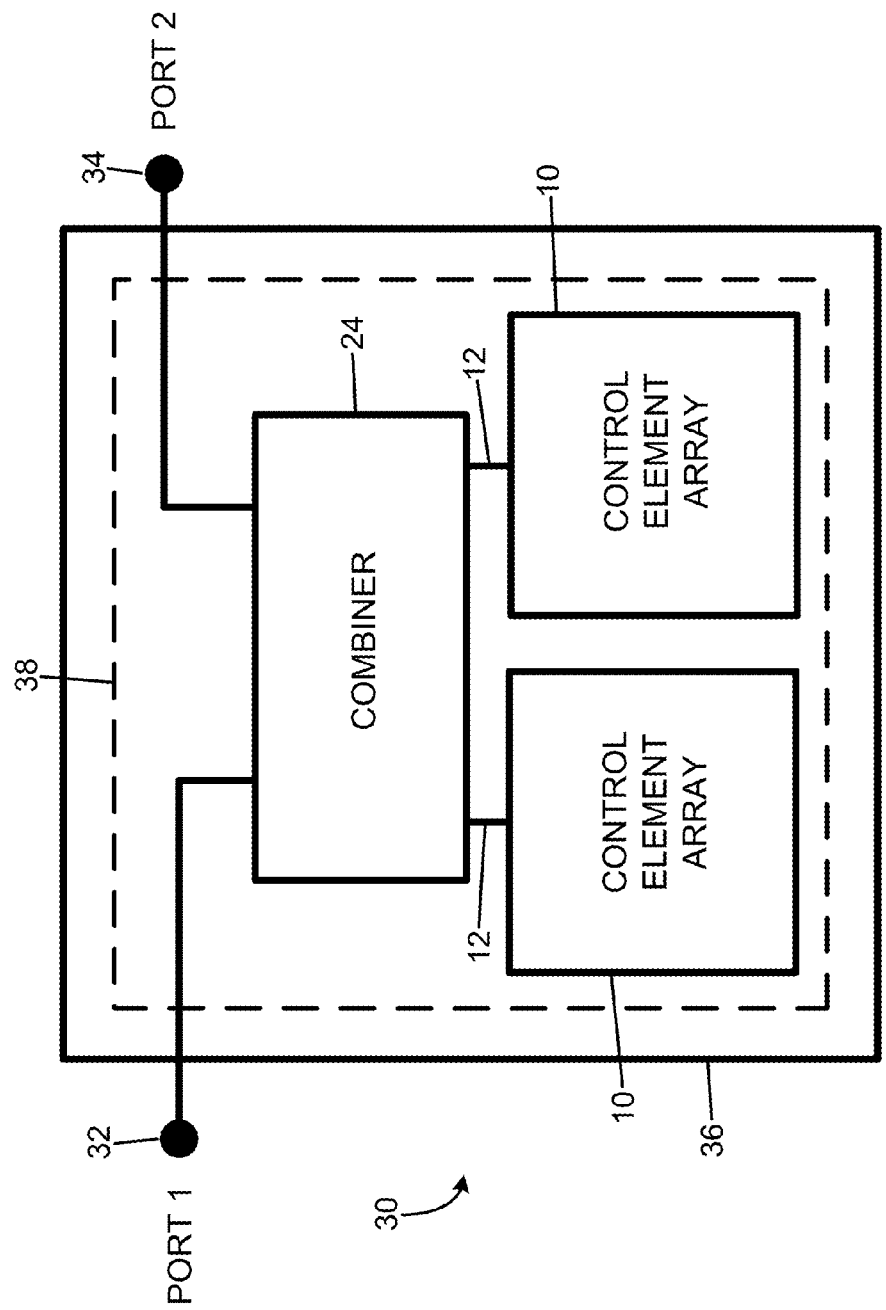
FIG. 2 illustrates an exemplary embodiment of a tuner module, including two control element arrays connected to a combiner circuit.

The following nomenclature applies to the description set out herein. A control element is a solid state device with controllable RF properties useful for controlling impedance. Examples include PIN diodes, FETs or other types of transistors. Control elements may be used as switching devices with two states per element, or with more than two states. A control element array, such as shown in FIG. 1, is a circuit with multiple control elements. A tuner module is a solid state circuit that can tune impedance and normally comprises multiple control elements. For example, FIG. 2 shows a tuner module comprising two control element arrays and a combiner. The diagram of FIG. 2 will be used herein to represent a tuner module, but it is understood that different types of tuner modules may be used. A solid state tuner may contain one or more tuner modules in one package with an external connector for each tuner port. A solid state tuner system is one or more solid state tuners in one package. A measurement system comprises one or more solid state tuners, along with measurement instrumentation. A measurement system may also include other types of tuners such as mechanical tuners.

Embodiments of this invention include a new electronic automated solid state tuner or solid state tuner system employing multiple solid-state tuner modules which when activated in combinations can generate tens or hundreds of thousands of impedance states. Such a solid-state tuner may employ multiple tuner modules cascaded in series or parallel, where each tuner module may include multiple control element arrays combined together. A control element array may include a number N of control elements, such as switches, that are spaced at predetermined lengths as well as their biasing circuitry. Each control element can be turned on (i.e. to the conductive state) individually, or multiple control elements can be turned on at the same time, to create a specific impedance with fixed magnitude and phase. In other embodiments, the bias voltage to each control element may have one or more intermediate levels, between voltage levels which turn the control element on and off.

Assuming, for the sake of example, that each control element array has 24 individual control elements, and only one is activated at a time, there exists 25 individual impedance states for the array. Therefore a tuner module, in which two control element arrays are combined, would have 25*25=625 impedance combinations. Cascading two tuner modules in series would offer 625*625=390,625 impedance states.

Activating multiple control elements simultaneously in each array increases the magnitude of reflection thereby allowing for a greater tuning range to be achieved.

Embodiments of this invention include solid state tuners or tuner systems in which multiple tuner modules are combined into one package or housing. This will reduce losses, thereby improving the matching range. This eliminates external interconnections between the tuners, improving stability and repeatability. The reduced loss also improves the matching range.

This also makes it practical to combine more than two solid state tuners to give more complete impedance coverage.

In general, cascading multiple tuners allows one degree of freedom for each tuner in the combination. So if two tuners are cascaded, two frequencies may be independently controlled. If three tuners are cascaded, three frequencies may be independently controlled. And if four tuners are cascaded, four frequencies may be independently controlled, and so on for any number of tuners.

Combining more tuners than the number of frequencies with independent impedance control improves the tuning resolution and the tuning independence between the frequencies. For example, three combined tuners will improve the tuning resolution and independence at two frequencies. Four or five combined tuners will improve the tuning resolution and independence at three frequencies, and so on. This principle is independent of whether the tuners are all in one package or in multiple packages. However, the single package concept still offers improved performance because of lower losses, better matching range, and better stability.

Putting two or more tuners in one package to control two frequencies improves on the prior art because of the lower losses and better matching range, but the tuning resolution and tuning independence will still have some limitations.

Two solid state tuners combined in one package allows the impedance at two frequencies to be independently controlled with better matching range than the prior art. More than two solid state tuners combined will give better impedance resolution and better tuning independence when two frequencies are to be independently controlled.

FIG. 1 is a schematic diagram showing an exemplary embodiment of a solid state control element array 10, comprising N solid state control elements S1 ... SN, arranged along transmission line 16, and separated from adjacent elements by transmission line segments 18. The control elements may be PIN diodes, or other solid state switching device, such as FETs or other transistors. Each control element is controlled by a control line L1 ... LN. A controller 20 is configured to selectively turn on or off each control element by application of a control signal to the corresponding control line, so that only one control element is in the conductive state at any given time. A bias voltage is applied to the transmission line 16 by power supply 16. Such arrays, to the extent just described, are known in the art, e.g. as described in U.S. Pat. Nos. 5,034,708 and 5,276,411. Other types of arrays controlled by solid state elements can alternatively be employed, e.g. switched transmission lines of different lengths, wherein the line length is controlled by solid state switching elements.

The array 10 includes an RF input port 12, and an RF output port 14, which in this exemplary embodiment is connected to ground, although in other embodiments the output port may be open circuited or connected to a load. By turning on, i.e. setting to a conductive state, different ones of the control elements while maintaining the remaining ones of the control elements in non-conductive states, the impedance presented by the array 10 to the input port 12 can be changed.

In accordance with one feature, multiple control elements of the array 10 can be switched on simultaneously. For example, three contiguous control elements, say S1, S2, S3 may be switched on, while the remaining control elements are switched off. If S14 is on, S15 and S16 may also be turned on. Alternatively, a plurality of non-contiguous control elements may be switched on simultaneously, while the remaining control elements are set to the off state. Simultaneous activation of multiple control elements in the array increases the magnitude of reflection thereby allowing for a greater tuning range to be achieved.

Two or more control element arrays 10 can be combined to form a tuner module in a single housing, in accordance with another aspect. FIG. 2 illustrates an exemplary tuner module 30, comprising two control element arrays 10 connected to a combiner circuit 24. The circuit 24 may be a 3 dB hybrid coupler, or other type of combiner network or device. In this example, the RF input ports 12 of each array 10 are respectively connected to the coupled ports of the coupler network, and the input and transmitted ports of the hybrid combiner are the port 1 and port 2 RF connector ports 32 and 34 of the tuner module 30. The tuner module 30 includes a housing 36 which encloses the arrays 10 and combiner 34. An advantage of this construction is that the connections between the arrays and the combiner need not be removable, or removed and reconnected for each use.

In accordance with a further aspect, the two control arrays 10 and the combiner circuit 24 may be constructed or mounted on a common printed wiring board (PWB), indicated by dashed line 38. In an exemplary embodiment, the control element arrays may be fabricated by surface mount technology (SMT), in which discrete control element chips are mounted to the PWB. Of course, other embodiments may employ other construction technologies.

Figure 3:
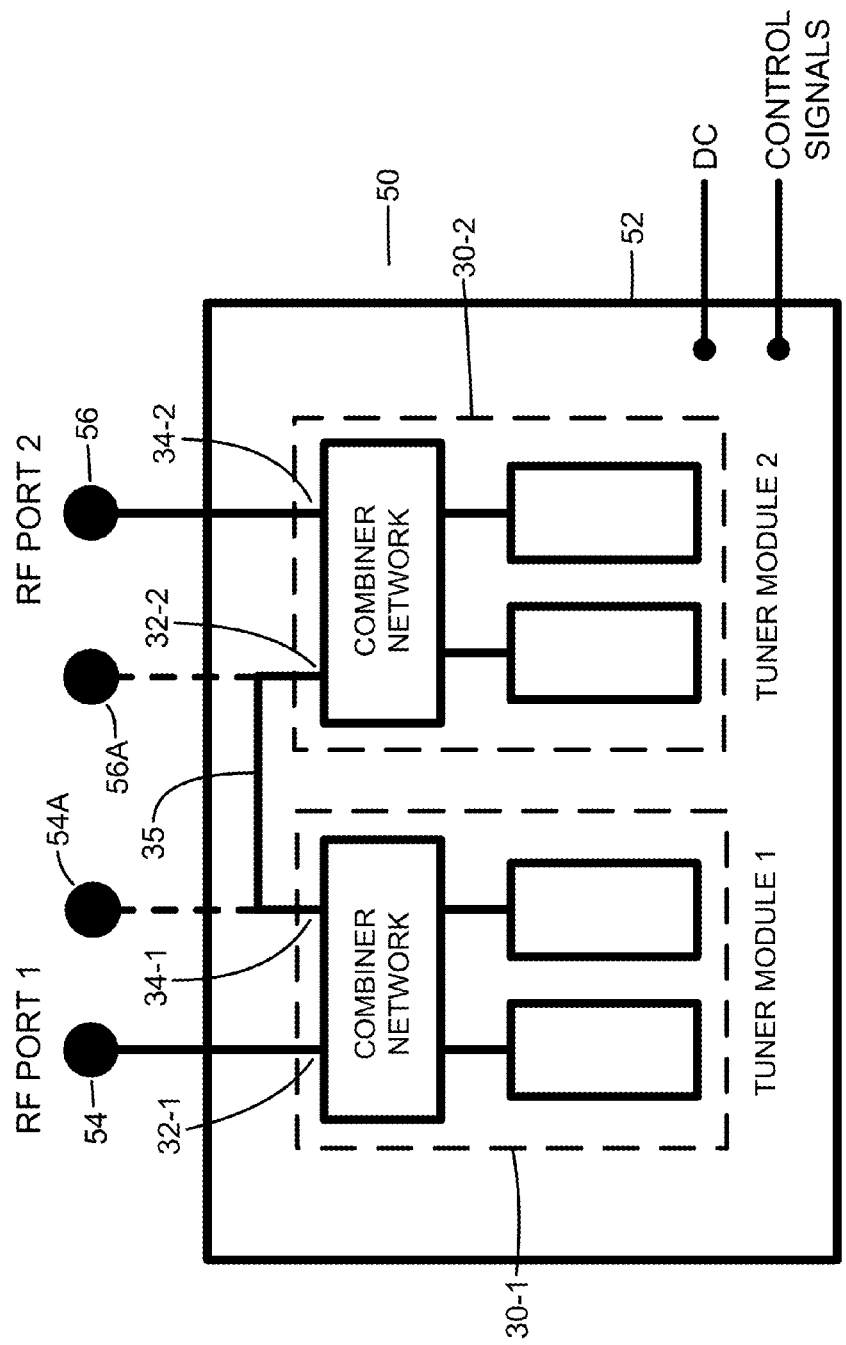
FIG. 3 illustrates another exemplary embodiment of a solid state tuner system, which includes two tuner modules cascaded together and disposed within a housing or package.

FIG. 3 illustrates another embodiment, in which a solid state tuner system 50 includes two tuner modules 30-1 and 30-2, cascaded together and disposed within a housing 52. The system 50 includes an RF port 1, labeled 54, and an RF port 2, labeled 56. The port 1 (32-1) of the first module 10-1 is connected to tuner system RF port 1 (54), and the port 2 (34-2) of the second module is connected to tuner system RF port 2 (56). The port 2 (34-1) of the first module is connected to the port 1 (32-2) of the second module. Thus, the solid state tuner system 50 includes two tuner modules 10, combined within one housing. The tuner system 50 may alternatively include external RF ports 54A, 56A, instead of an internal connection 35 between the tuner modules 30-1 and 30-2. In this case, the user is afforded the flexibility to cascade the two tuner modules together by use of an RF jumper cable connecting ports 54A and 56A, or to use the tuner modules in other ways, e.g. as separate tuners.

Figure 3A:
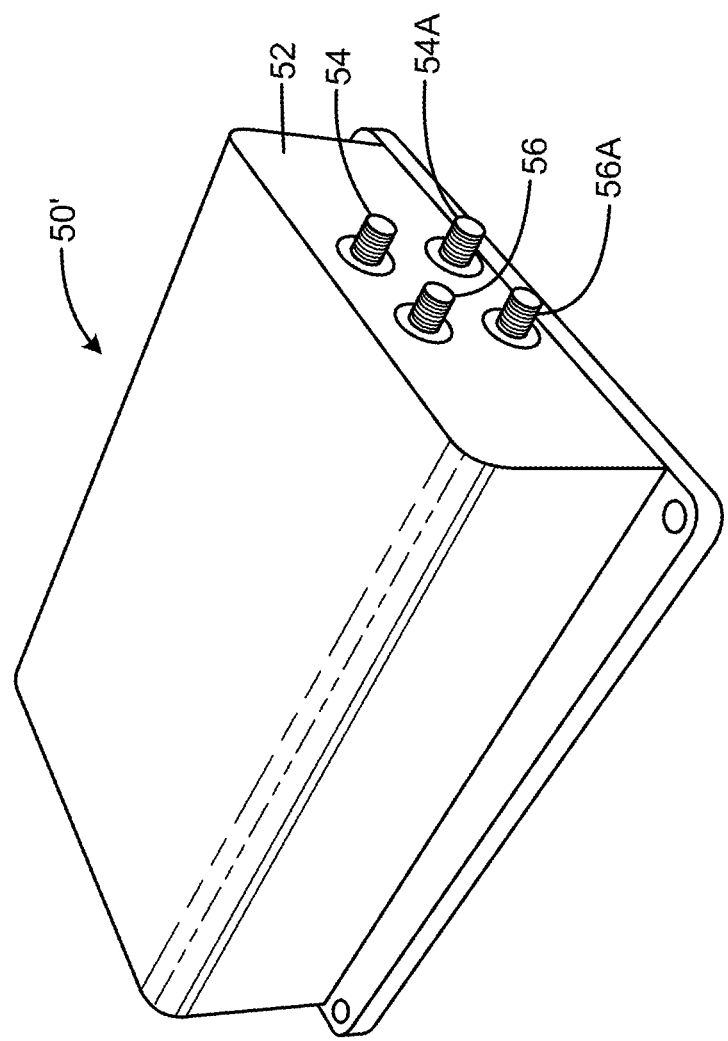
FIG. 3A illustrates an external configuration of an exemplary tuner system.

FIG. 3A illustrates an external configuration of an exemplary tuner system 50', as described above, in which the circuitry of the tuner system is disposed within a housing 52. Separate RF connectors 54, 54A, 56 and 56A are mounted to the housing for connection in a measurement system. The tuner system 50' has two tuner modules, each with external RF ports 1 and 2, respectively corresponding to connectors 54, 54A, 56, 56A. The system also includes control signal and dc power connectors (not shown in FIG. 3A).

Figure 4:
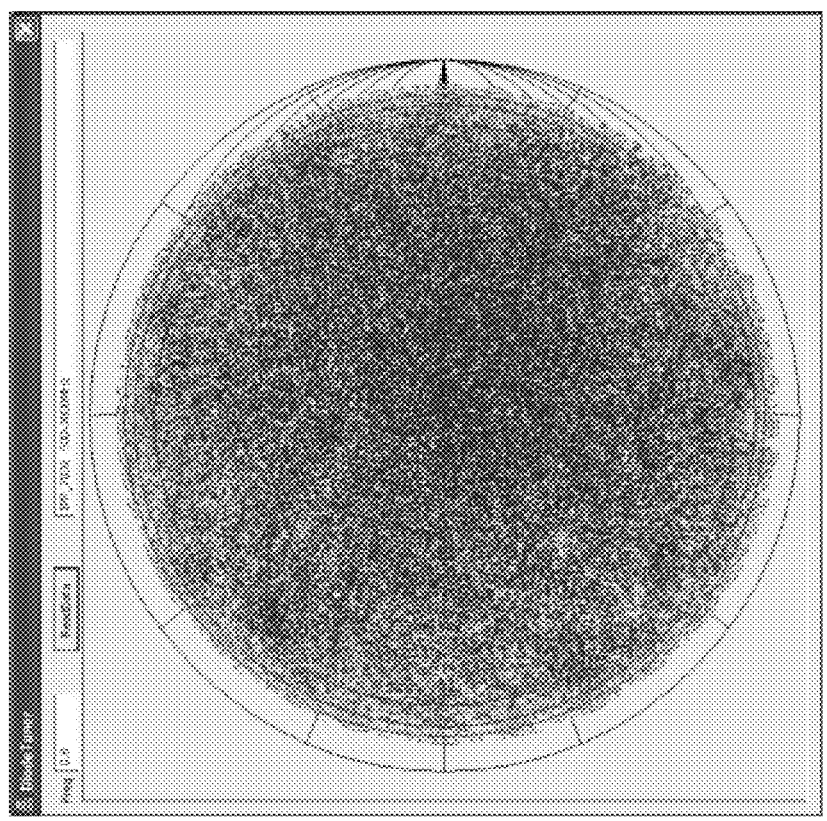
FIG. 4 is a Smith chart representation of the different impedance values provided by an exemplary embodiment of a tuner system including two cascaded tuner modules.

FIG. 4 is a Smith chart representation of the different impedance values provided by an exemplary embodiment of a tuner system 50 comprising two cascaded tuner modules.

Figure 5:
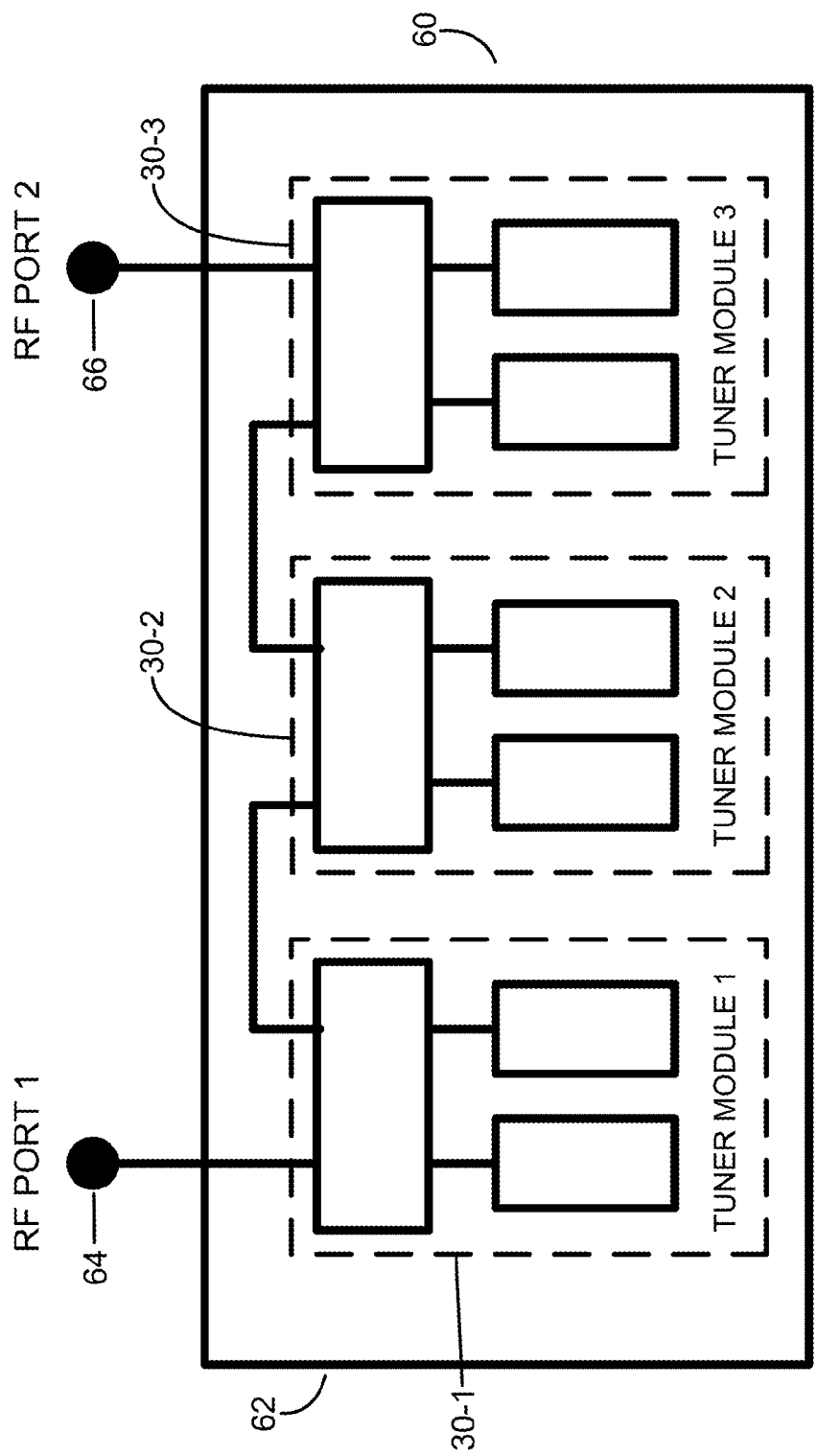
FIG. 5 illustrates an exemplary embodiment of a tuner system including three tuner modules cascaded together and disposed within a housing.

FIG. 5 illustrates another embodiment, in which a solid state tuner 60 includes three tuner modules 30-1, 30-2 and 30-3, cascaded together and disposed within a housing or package 62. The tuner 60 includes an RF port 1, labeled 64, and an RF port 2, labeled 66. The port 1 of the first module 30-1 is connected to tuner RF port 1 (64), and the port 2 of the third module 30-3 is connected to tuner RF port 2 (66). The port 2 of the first module is connected to the port 1 of the second module, and the port 2 of the second module is connected to the port 1 of the third module.

Figure 6:
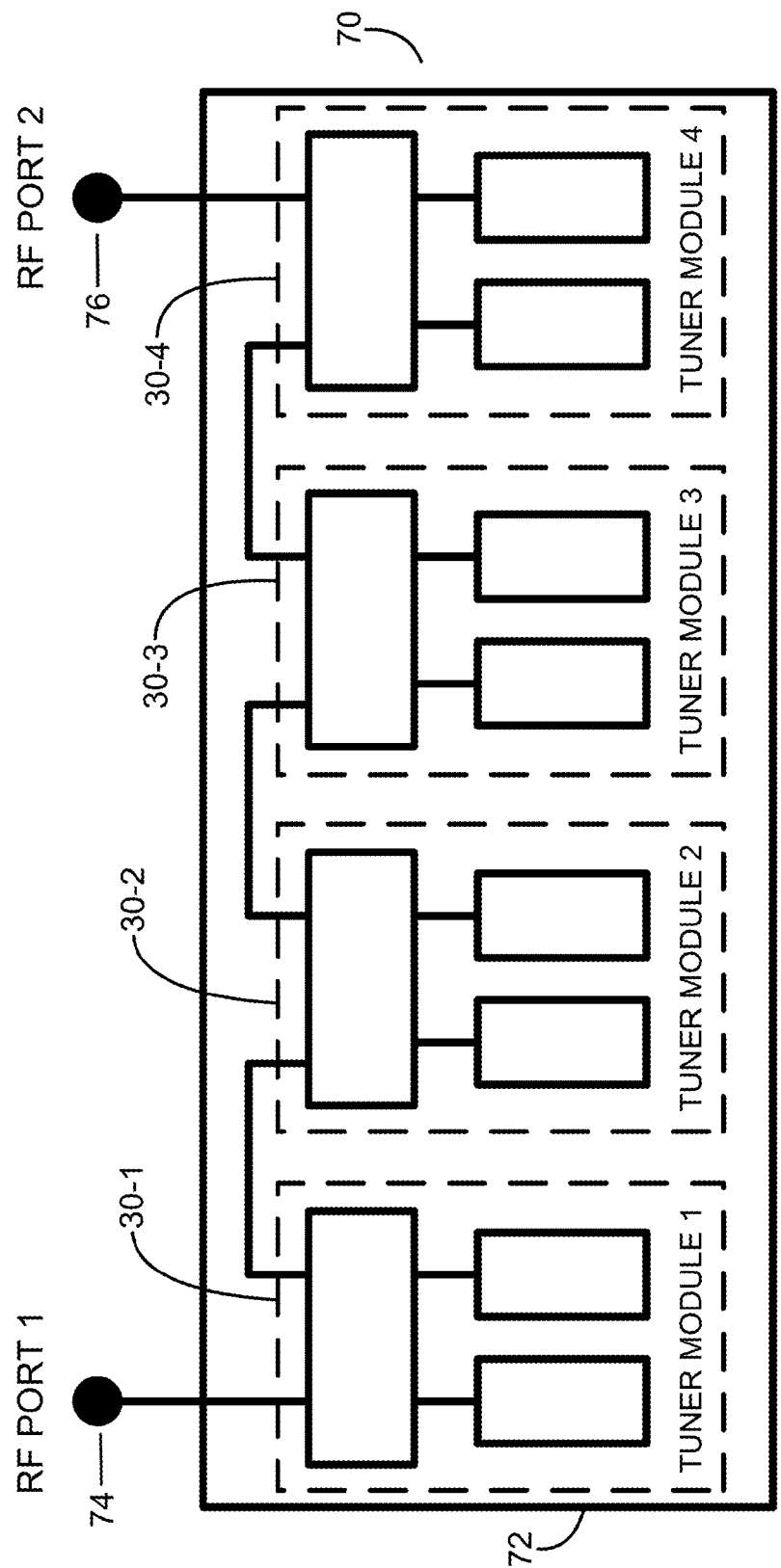
FIG. 6 illustrates an exemplary embodiment of a tuner system including four tuner modules cascaded together and disposed within a housing.

A solid state tuner or tuner system can be made up of N solid state tuner modules, arranged in a cascaded configuration. FIG. 5 shows the case in which N=3. FIG. 6 illustrates another embodiment, in which N=4, in a tuner system 70 including four tuner modules 30-1, 30-2, 30-3 and 30-4, cascaded together and disposed within a housing or package 72. The system 70 includes an RF port 1, labeled 74, and an RF port 2, labeled 76. The port 1 of the first module 30-1 is connected to tuner system RF port 1 (74), and the port 2 of the fourth module 30-4 is connected to tuner system RF port 2 (76). The port 2 of the first module is connected to the port 1 of the second module, and the port 2 of the second module is connected to the port 1 of the third module. The port 2 of the third module is connected to the port 1 of the fourth module. Of course, for particular applications, the number of cascaded solid state impedance tuner modules could be increased beyond 4.

Figure 7:
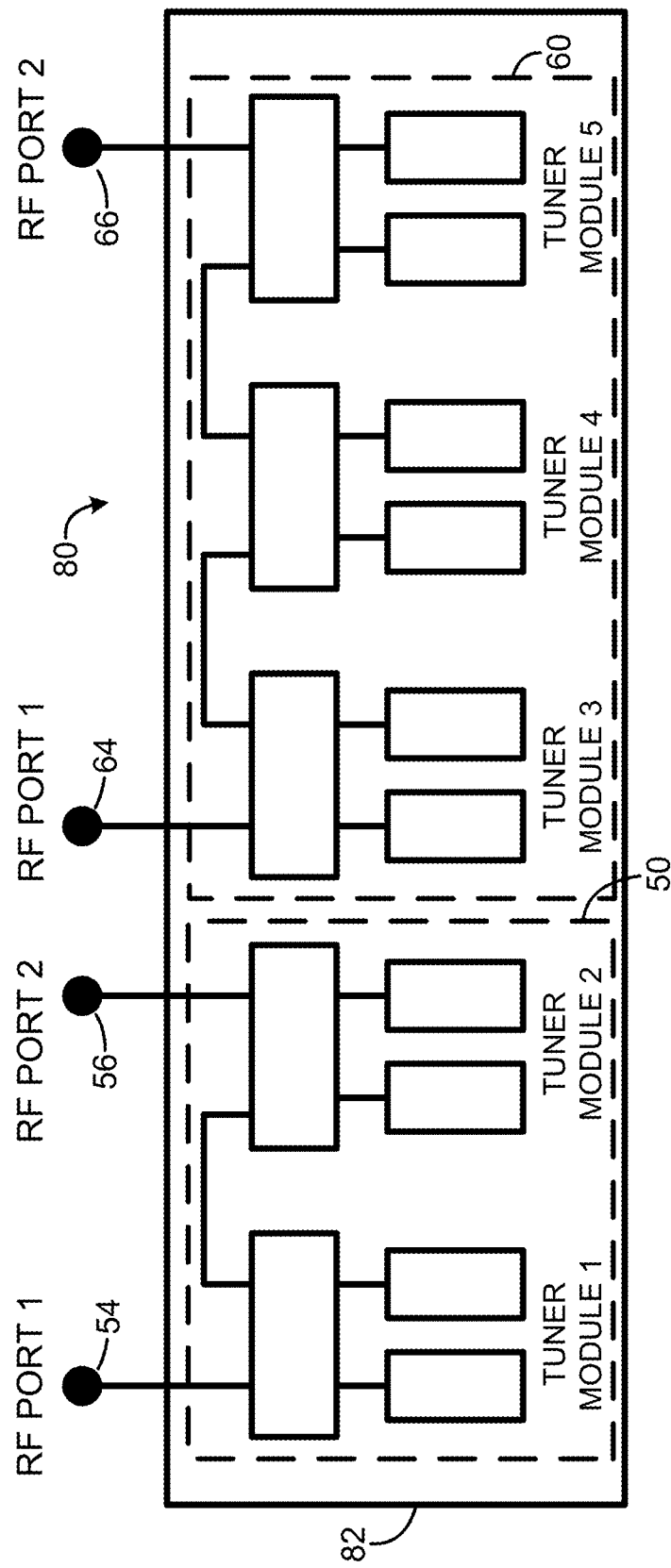
FIG. 7 illustrates an exemplary embodiment of a tuner system, in which a dual solid state tuner and a triple solid state tuner system are combined in one package or housing.

FIG. 7 illustrates another exemplary embodiment of a solid state tuner system 80, in which a dual solid state tuner 50 (as in FIG. 3) is packaged with a triple solid state tuner 60 (as in FIG. 5), in a single housing or package 82. The RF ports (54, 56, 64, 66) of the respective dual and triple tuners are brought out for connection in a measurement system.

Figure 8:
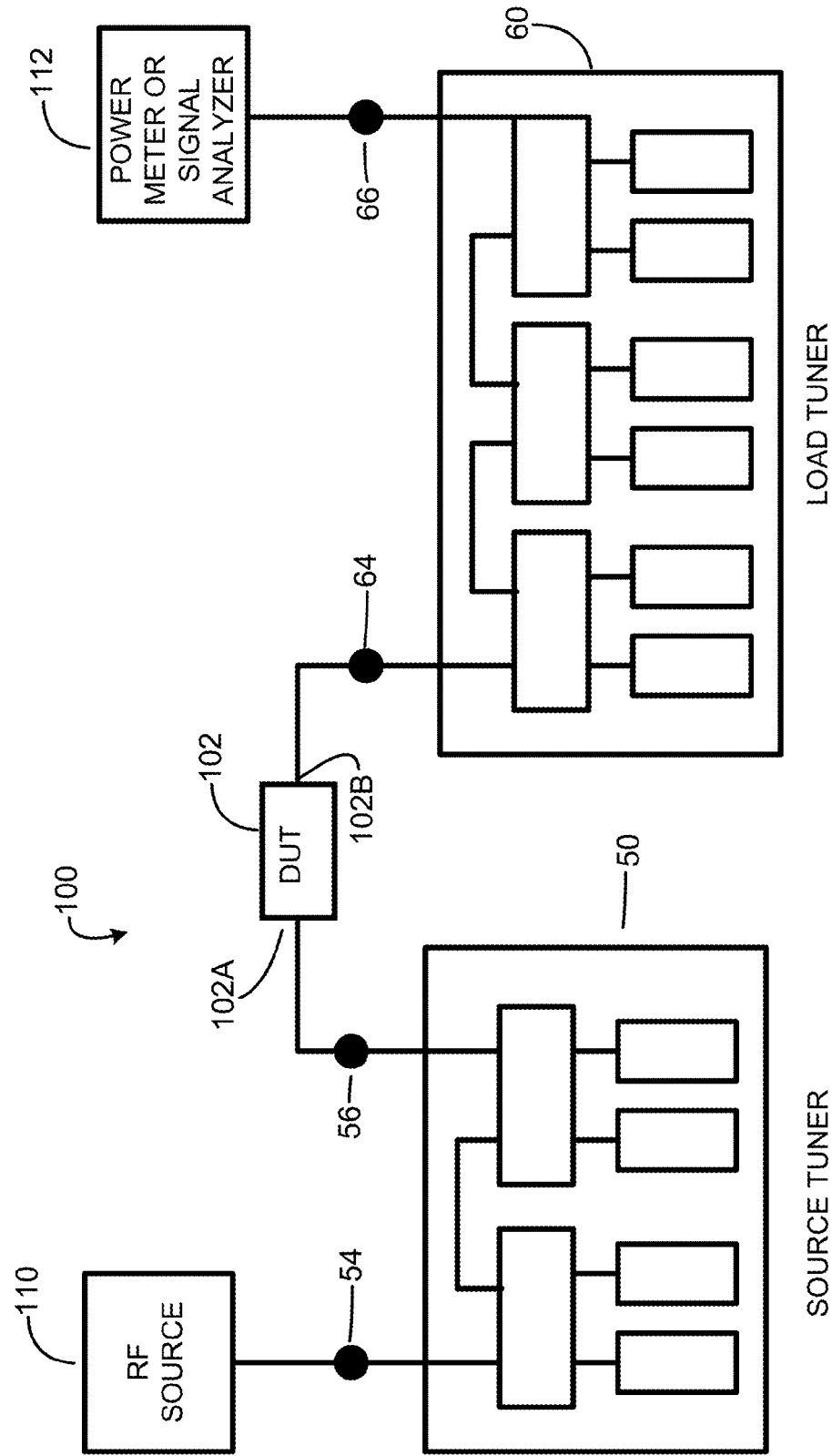
FIG. 8 illustrates an exemplary embodiment of a measurement system for measuring characteristics of a device under test (DUT), in which two solid state tuner modules are combined in a single package and used for source tuning, and three tuners are combined in a single package and used for load tuning.

FIG. 8 illustrates an exemplary measurement system 100, for measuring characteristics of a DUT 102. In this embodiment, RF port 2 (56) of a dual solid state tuner 50 is connected to a first DUT port 102A, to function as a source tuner for an RF source 110, connected to RF port 1 (54) of the tuner 50. A triple solid state tuner 60 has RF port 2 (64) connected to a second DUT port 102B, to function as a load tuner. A power meter or other signal analyzer 112 is connected to RF port 2 (66). The system 100 may perform load pull measurements on the DUT, for example.

Figure 9:
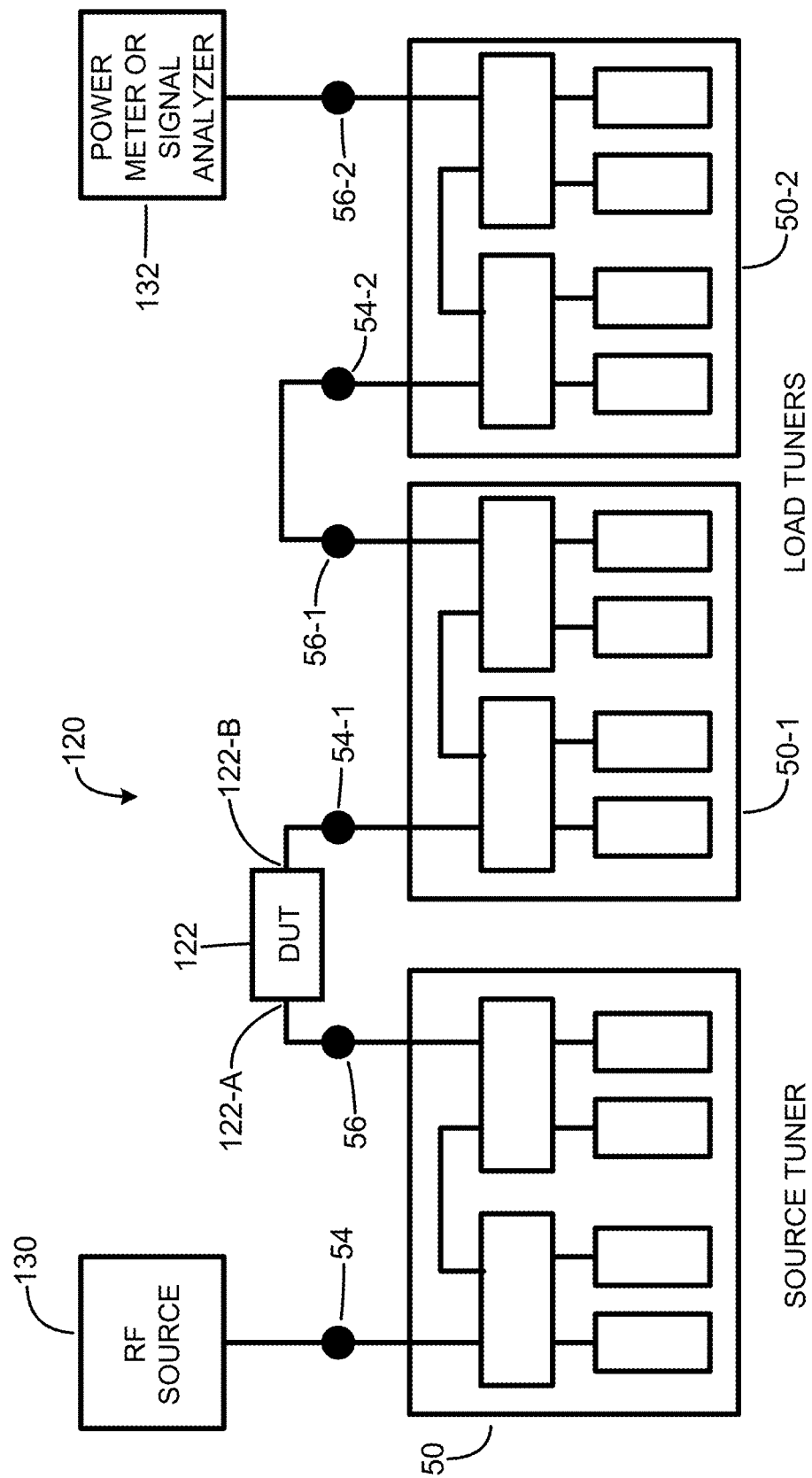
FIG. 9 illustrates an exemplary embodiment of a measurement system for measuring characteristics of a DUT, in which two solid state tuner modules are combined in a single package and used for source tuning, and two dual tuner modules each combined in a housing, and cascaded together and used for load tuning.

FIG. 9 illustrates another exemplary measurement system 120, for measuring characteristics of a DUT 122. In this embodiment (as with the system 100 of FIG. 8), RF port 2 (56) of a dual solid state tuner 50 is connected to a first DUT port 122A, to function as a source tuner for an RF source 130, connected to RF port 1 (54) of the tuner 50. Two dual solid state tuners 50-1 and 50-2 are cascaded together to function as load tuners for the DUT 122. RF port 1 (54-1) of tuner 50-1 is connected to a second DUT port 1228 to cascade the two tuners. RF port 2 (56-1) of tuner 54-1 is connected to RF port 1 (54-2) of the second dual solid state tuner 50-2. RF port 2 (56-2) of tuner 50-2 is connected to a power meter or other signal analyzer 132. In an alternate embodiment, the two dual solid state tuners 50-1 and 50-2 could be combined into one package to make one solid state tuner system to function as a load tuner for the DUT. This system may be used to perform load pull measurements on the DUT 122.

Figure 10:
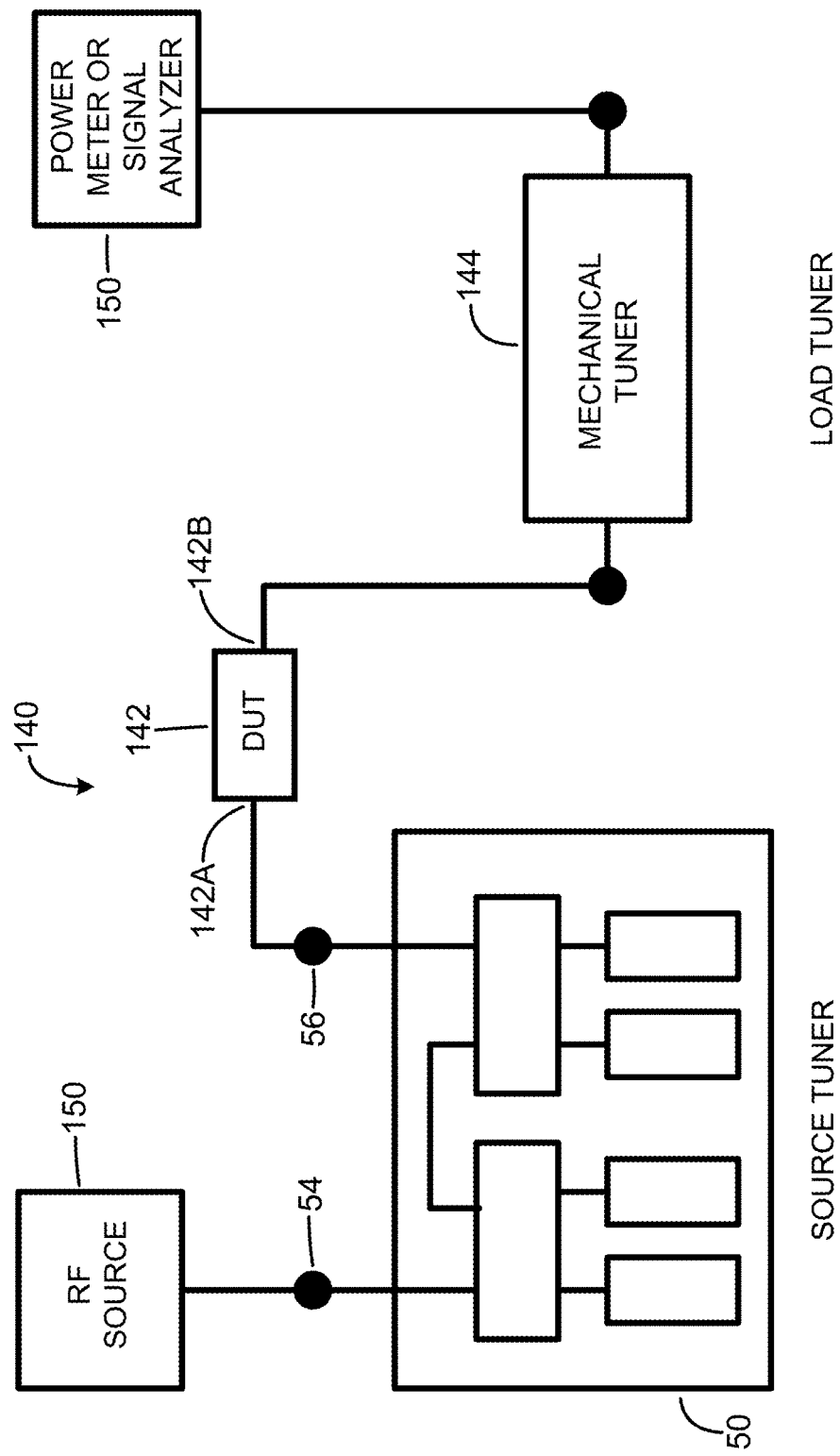
FIG. 10 illustrates an exemplary embodiment of a measurement system for measuring characteristics of a DUT, in which two solid state tuner modules are combined in a single package and used for source tuning, and a mechanical tuner is used for load tuning.

FIG. 10 illustrates yet another measurement system 140 for measuring characteristics of a DUT 140. This system utilizes a dual solid state tuner system 50 as the source tuner, connected between the RF source 150 and a first DUT port 142A. A mechanical tuner 144 is employed as the load tuner in this embodiment, connected between a second DUT port 142B and a power meter or signal analyzer 152. Mechanical tuners are well known in the art; one type is electromechanical, which allow the tuner operation to be automated. Exemplary electromechanical tuners are commercially available, e.g. from Maury Microwave, Inc. The system 140 may be used to perform load pull measurements, for example.

Figure 11:
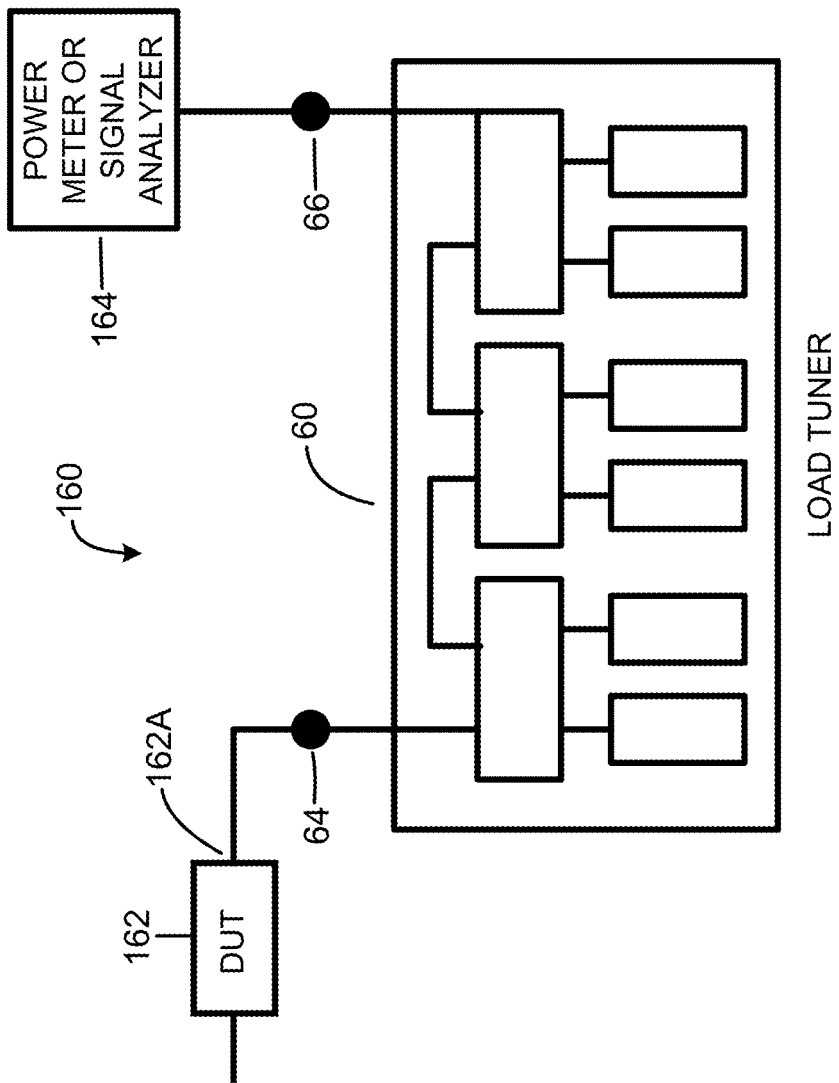
FIG. 11 illustrates an exemplary measurement system for measuring characteristics of a DUT, employing a triple solid state tuner combined in a single package and used as the load tuner.

FIG. 11 illustrates an exemplary measurement system 160 for measuring characteristics of a DUT 162. In this example, the load tuner is a triple solid state tuner 60, with its RF port 1 (64) connected to a first DUT port 162A, and its RF port 2 (66) connected to a power meter or other signal analyzer 164). The DUT 162 in this example may generate its own source signal, or be configured to wirelessly receive a source signal (for the case in which the DUT is a cell phone chip or device, for example).

Figure 12:
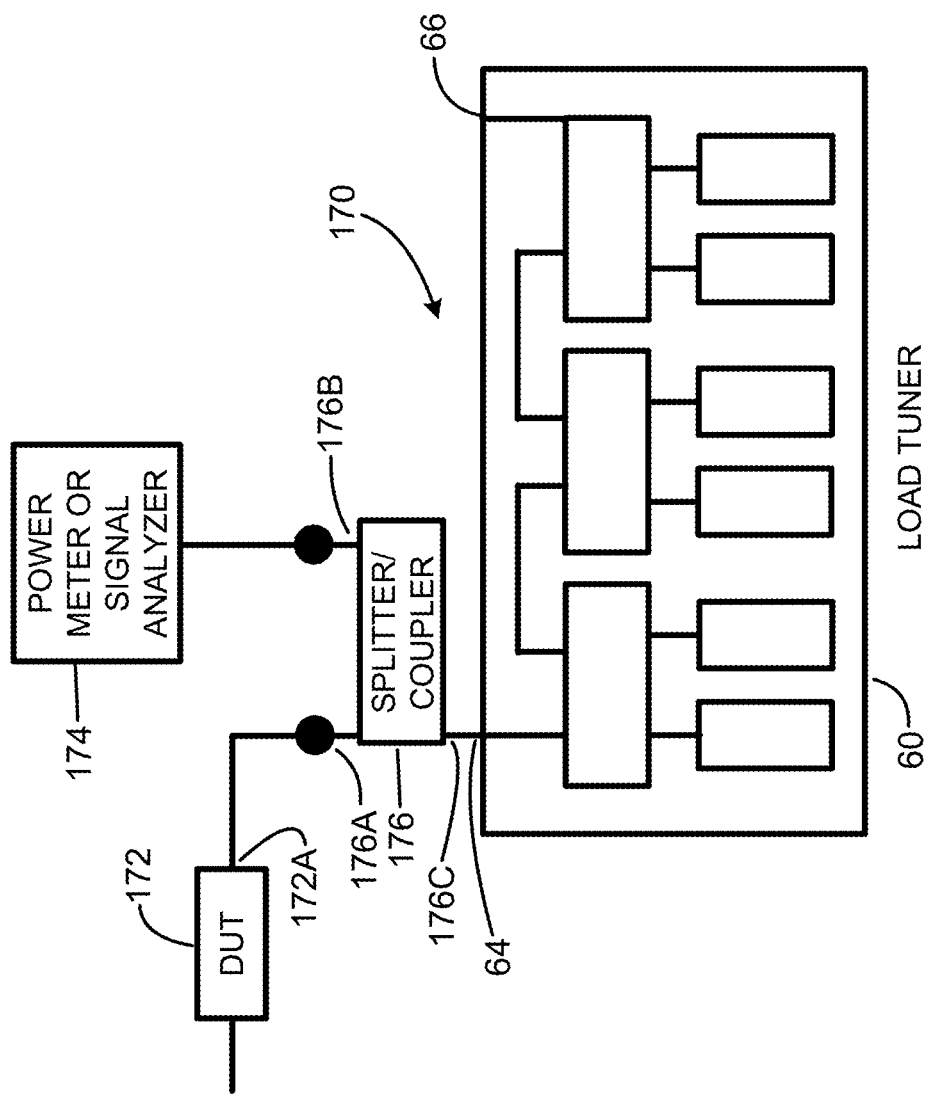
FIG. 12 illustrates another exemplary measurement system for measuring characteristics of a DUT, employing a triple solid state tuner combined in a single package and used as the load tuner, with a splitter/coupler network connected between the DUT, the load tuner and a signal analyzer.

FIG. 12 illustrates yet another exemplary measurement system 170 for measuring characteristics of a DUT 172. In this example, the load tuner is a triple solid state tuner 60. A splitter/coupler 176 has a port 176A connected to a first DUT port 172A. A second splitter/coupler port 176B is connected to a power meter or signal analyzer 174. The RF port 1 (64) of the tuner 60 is connected to a third splitter/coupler port 176C. A portion of the signal from the port 172A of DUT 172 is coupled to the power meter or signal analyzer, and another portion of the signal is coupled to RF port 1 of the load tuner 60. The second RF port 2 (66) may be connected to a load or other instruments that are part of the measurement system. The DUT 172 in this example may generate its own source signal, or be configured to wirelessly receive a source signal (for the case in which the DUT is a cell phone chip or device, for example).

The following nomenclature applies to the description set out herein. A state of a tuner module is one control setting that sets one particular impedance with that tuner module. A state of a solid state tuner or tuner system is one particular combination of states of all of the tuner modules in that solid state tuner or tuner system. The Z0 state of a tuner module is a designated state that ideally should have low reflection. The Z0 state of a solid state tuner or tuner system is the tuner state where all internal tuner modules are set to their respective Z0 states. The whole tuner body means the complete solid state tuner or tuner system in the Z0 state.

Figure 13:
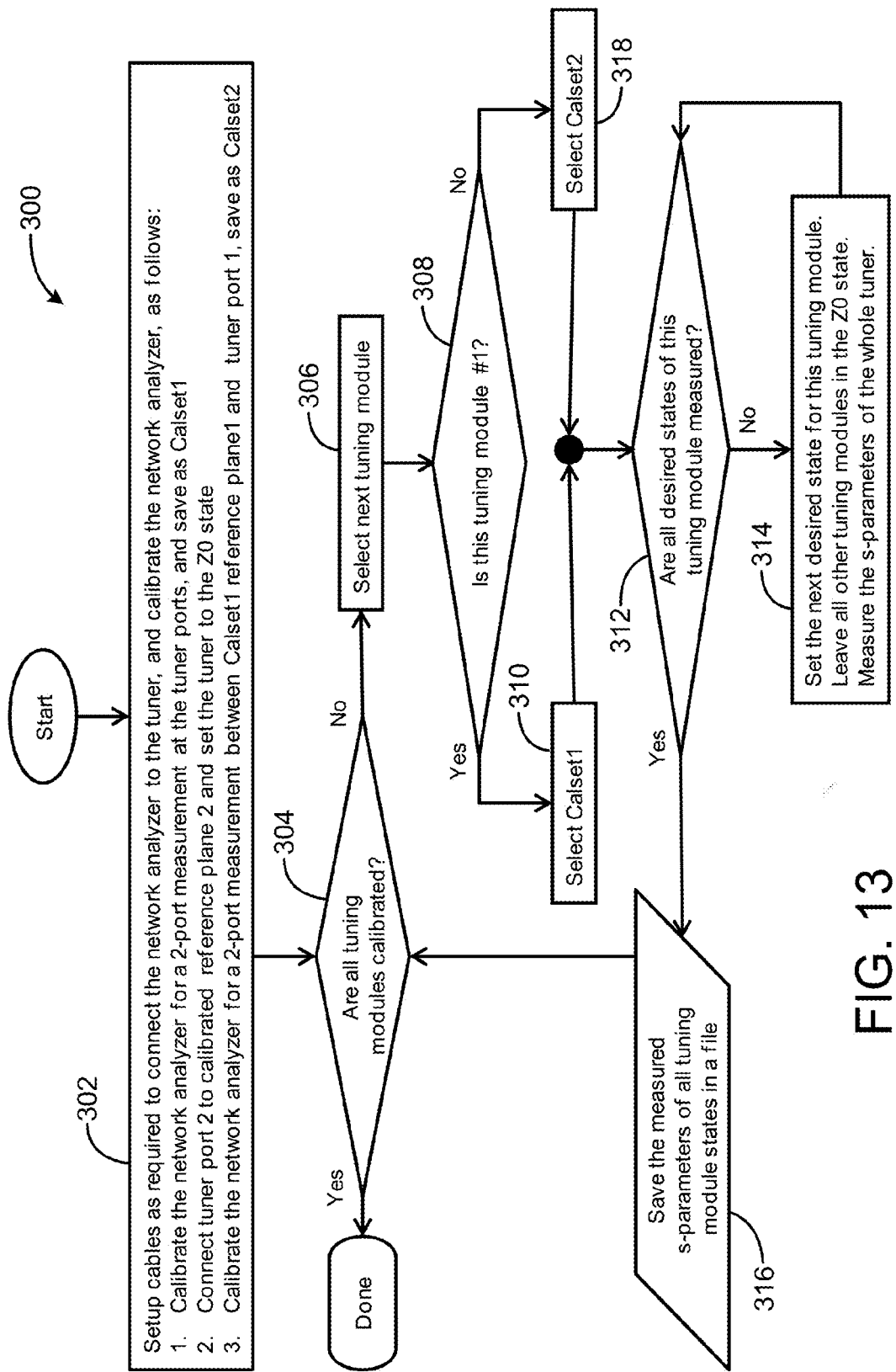
FIG. 13 is a flow diagram illustrating an exemplary calibration method for multiple cascaded solid state tuners.

An exemplary calibration method 300 for a solid state tuner with multiple tuner modules includes the following steps, and is illustrated in FIG. 13:

At step 302: 1. Calibrate the network analyzer for a 2-port measurement at reference planes that will connect to the tuner connectors. Save this calibration and call it Calset1. 2. Connect port 2 of the solid state tuner to the port 2 of the Calset1 reference planes. 3. Calibrate the network analyzer again, where the reference plane of port 1 is the same reference plane as port 1 in Calset1, and the reference plane of port 2 is port 1 of the solid state tuner. Save this calibration, and call it Calset2. Connect port 1 of the tuner to reference plane 1, which is the same for both Calsets.

At step 304, determine whether all tuner modules have been calibrated. If so, the calibration is completed. If not, the next tuner module is selected at 306.

At 308, if the next tuner module to be calibrated is tuner module 1, select Calset1 (310). Otherwise, select Calset2 (318). At 312, 314, measure the s-parameters of the whole tuner for every desired state of the selected tuner module, as follows.

a) Leave all of the tuner modules in the Z0 state except for the tuner module being calibrated (tuner module N).

b) Measure the s-parameters of the whole tuner for every desired state of tuner module N. This could be all of the available states of tuner module N or a subset of available states. Save all of the s-parameters of tuner module N in a file.

The s-parameters of the tuner module calibrated with Calset1 in the above procedure include the whole tuner body in the Z0 state. The s-parameters of the remaining tuner modules do not include the whole tuner body. This means that when the calibrated s-parameters of all the tuner modules in the solid state tuner are mathematically cascaded together, the whole tuner body will only be included once, so the resulting s-parameters will be correct. The state of each tuner module may be selected independently from all other tuner modules, and the cascading should use the s-parameters associated with the selected state of each tuner module.

The procedure can be varied and still get valid results. Some valid variations include the following:

1) Any one of the tuner modules may calibrated with Calset1 (which includes the whole solid state tuner body), as long as all remaining tuner modules are calibrated with Calset2 (which excludes the whole solid state tuner body).

2) The order of the procedure may also be varied. The two calibrations may be done in any order, and the calibration of all the tuner modules may be done in any order. In addition, tuner modules which are not needed for a particular application may be left in the Z0 state, and the calibration skipped for that tuner module.

3) In the above procedure, the reference planes of Calset2 are both at port 1 of the solid state tuner. It would work just as well if the Calset2 is created with both reference planes at port 2 of the solid state tuner.

4) Calset2 may be created with an entirely new calibration, or it may be created automatically as follows:

a) Measure the s-parameters of the whole tuner body in the Z0 state using Calset1.

B). Cascade the s-parameters of the whole tuner body with the error terms of either port 1 or port 2 of Calset1, and save the new error terms as Calset2. This approach should give the same results, but may be more convenient.

Figure 14:
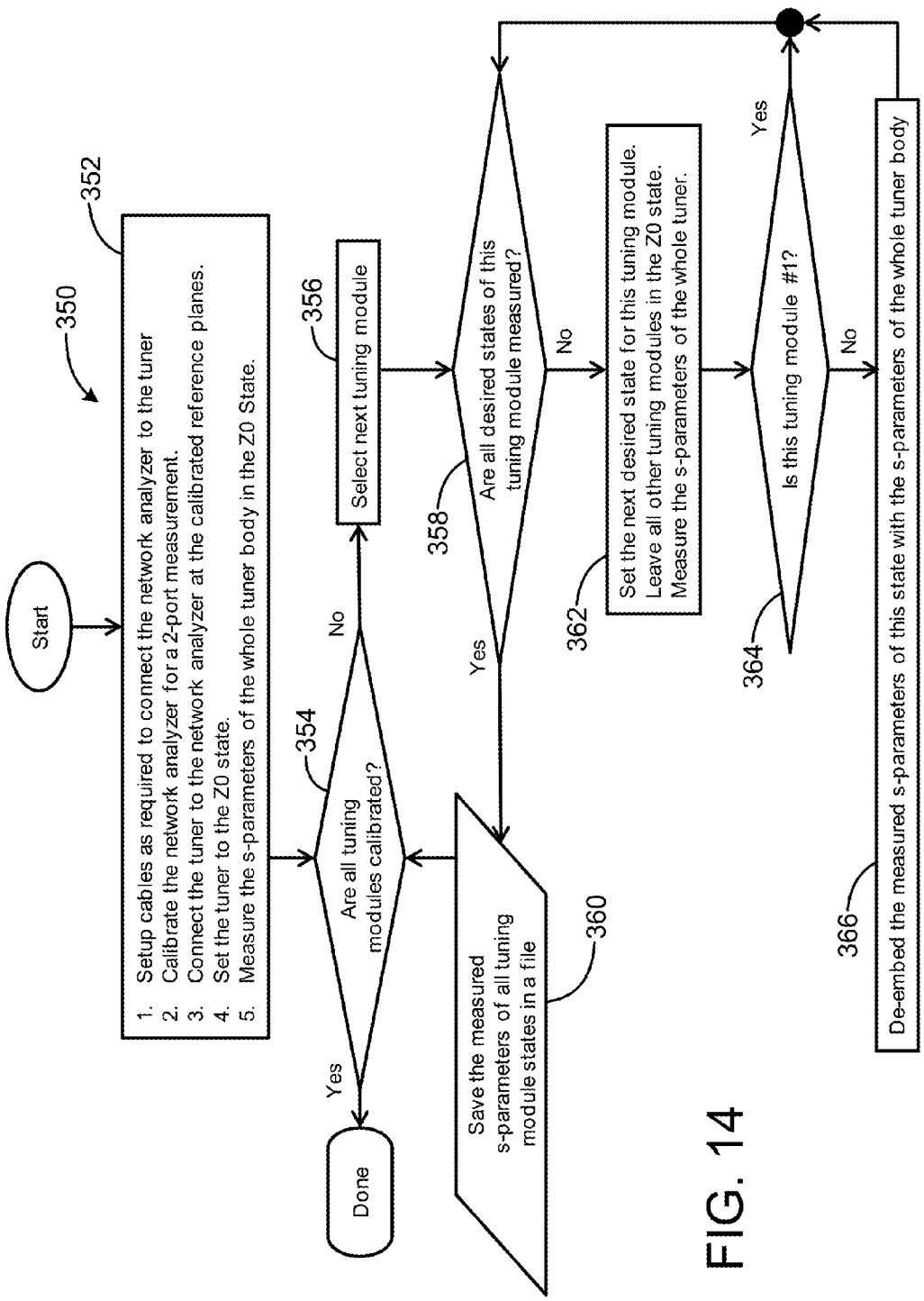
FIG. 14 is a flow diagram illustrating another exemplary calibration method for multiple cascaded solid state tuners.

Another exemplary calibration method 350 for a solid state tuner with multiple tuner modules includes the following steps, and is illustrated in FIG. 14:

At step 352: 1. Calibrate the network analyzer for a 2-port measurement at reference planes that will connect to the tuner connectors. 2. Connect the tuner to the network analyzer at the calibrated reference planes. 3. Set the tuner to the Z0 state. 4. Measure the s-parameters of the whole tuner body in the Z0 state.

At step 354, determine whether all tuner modules have been calibrated. If so, the calibration is completed. If not, the next tuner module is selected at 356.

At steps 362-366, each tuner module is calibrated one at a time as follows:

A) Leave all of the tuner modules in the Z0 state except for the tuner module being calibrated. Measure the s-parameters of the tuner for every desired state of the tuner module being calibrated. This could be all of the available states of this tuner module or a subset of available states (362).

B) If the tuner module is not tuner module 1 (364), de-embed the Z0 state of the solid state tuner from the s-parameters of every calibrated state (366). The following equations may be used this de-embedding:

$$S_{22a} = \frac{S_{22c} - S_{22b}}{S_{11b}(S_{22c} - S_{22b}) + S_{12b}S_{21b}}$$

$$S_{12a} = \frac{S_{12c}(1 - S_{22a}S_{11b})}{S_{12b}}$$

$$S_{21a} = \frac{S_{21c}(1 - S_{22a}S_{11b})}{S_{12b}}$$

$$S_{11a} = S_{11c} - \frac{S_{12a}S_{21a}S_{11b}}{1 - S_{22a}S_{11b}}$$

Where Sa is the resulting 2-port s-parameter set, Sb is 2-port s-parameter set of the whole tuner body, and Sc is the original measured s-parameter set.

The procedure is repeated until all tuner modules have been calibrated (step 354). Save all of these measured s-parameters in a file (360).

The procedure can be varied and still get valid results. Some valid variations include:

1) Any one of the tuner modules may left un-de-embedded (therefore including the s-parameters of the whole tuner body) as long as all remaining tuner modules are de-embedded.

2) The de-embedding may be done by other mathematical approaches such as using matrices instead of the discrete equations listed.

3) The measured s-parameters may be saved in multiple electronic files (for example, one file for each tuner module) or all combined into one file. This applies to all calibration methods, as the intent is to save the s-parameter data in a way that can be retrieved for later use.

Either of the above exemplary calibration procedures may also be used to calibrate separate cascaded tuners, as well as multiple tuner modules within a tuner.

Figure 15:
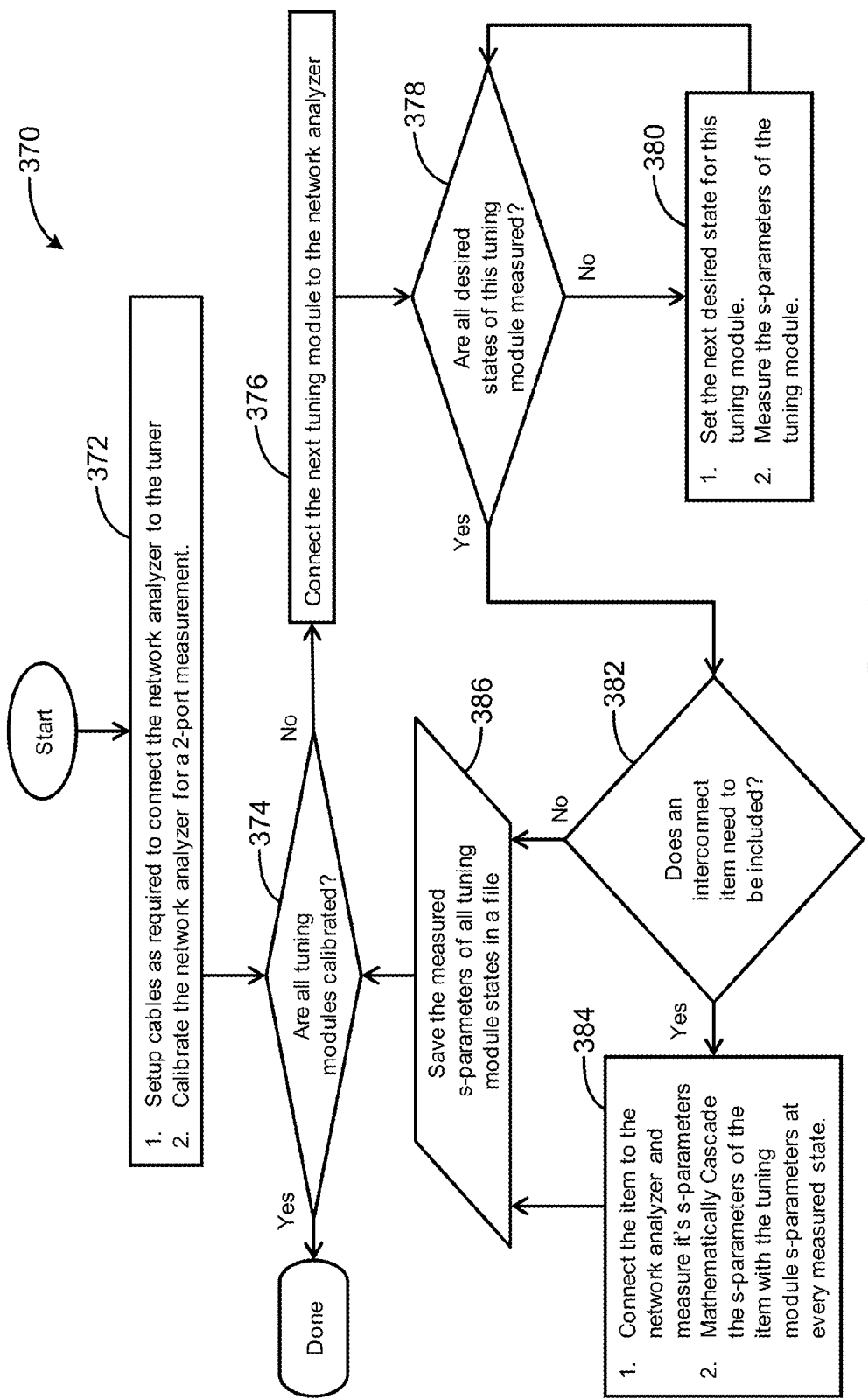
FIG. 15 is a flow diagram illustrating an exemplary calibration method for multiple cascaded solid state tuner modules in which each tuner module has external connectors.

Another exemplary calibration method for a solid state tuner with multiple tuner modules, where each tuner module has external connectors, includes the following steps, and is illustrated in FIG. 15:

At step 372, calibrate the network analyzer for a 2-port measurement at reference planes that will connect to the tuner connectors.

At 374-386, each tuner module is calibrated, one at a time as follows:

A) At 376, connect the tuner module to the network analyzer using the external connectors of that tuner module. If adapters or other items will be connected in the later use of the tuner and its calibration data, they can be considered part of the tuner module.

B) At 380, if all desired states of the module have not been measured, the s-parameters of the tuner module are calculated for every desired state. This could be all of the available states of this tuner module or a subset of available states.

C) Optionally, step 382, if an interconnect item such as a jumper cable is to be used to connect this tuner module to another tuner module, do the following (384):

i) Connect the interconnect item to the network analyzer and measure its s-parameters.

ii) Mathematically cascade the measured s-parameters of the interconnect item with the s-parameters of the tuner module at every measured state of the tuner module. The result is that the interconnect item is included in the calibration of this tuner module D) Save the final s-parameters for every measured state of the tuner module in a file for later use (386).

In the above procedure, the tuner modules may be calibrated in any order. The intent is to have s-parameters that can be cascaded mathematically to correctly match the overall s-parameters of the tuner when it is later used in an application, for any combination of calibrated tuner module states. If a jumper cable is used to interconnect tuner modules, it must be included, for example.

The procedure can be varied to meet the requirements of the intended application. For example, instead of including an interconnect jumper cable in the calibration, anything that will be connected later in the use of the tuner could be included in a manner similar to that described for the interconnect item.

In accordance with a further aspect, a solid state tuner may be implemented on a printed circuit card, for use in a chassis providing control and power to cards installed in connector receptacles. For example, a modular instrumentation platform known as PXI (PCI extensions for instrumentation) is well known in the instrumentation industry, and promoted by the PXI Systems Alliance. Modules having a standardized form factor or which conform to a PXI architecture can be installed in a chassis by connection to a chassis connector. The PXI Systems Alliance has promulgated specifications for the PXI standards and architecture, and these are available at http://pxisa.org/Specifications/. Exemplary ones of the specification documents are "PXI-1 Hardware Specification Rev. 2.2," Sep. 22, 2004 and "PXI-4 Module Description Rev. 1.1," Oct. 18, 2012; the entire contents of these documents are incorporated herein by this reference. The chassis includes a backplane, typically with multiple connectors, to provide power and control signals to the modules installed on the chassis. The chassis typically includes an embedded computer or controller module, which can be programmed to control the function and operation of the installed modules. A front panel of the chassis allows access to ports and connectors on each installed module.

Figure 16:
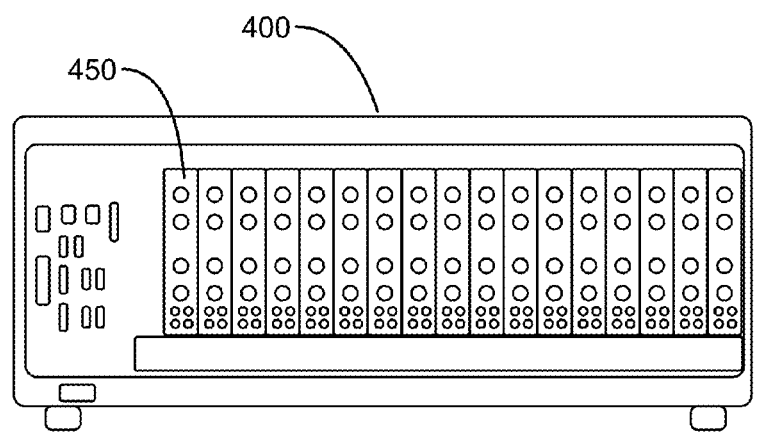
FIG. 16 depicts a front view of a PXI chassis in which multiple module cards have been installed, including an exemplary tuner module card.
Figure 17:
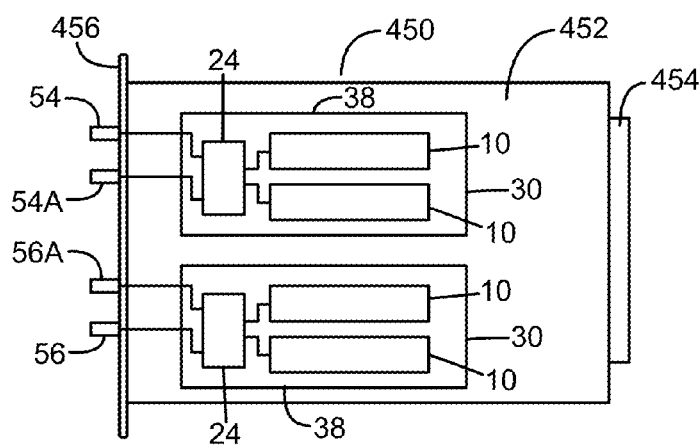
FIG. 17 is a schematic side view of the tuner module card.
Figure 18:
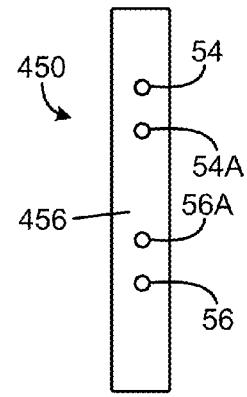
FIG. 18 is a front view of the tuner module card.

FIG. 16 depicts a front view of a PXI chassis 400 in which multiple module cards have been installed, including exemplary tuner module card 450. The tuner module card has a standardized form factor or architecture for the PXI system, and at least one solid state tuner module integrated in the card. FIGS. 17 and 18 illustrate exemplary features of the card 450, with FIG. 17 a side view of the card and FIG. 18 a front view. This exemplary tuner module card includes a chassis board 452, on which are mounted the respective printed circuit boards 38 for two tuner modules 30 as described above regarding FIG. 3. Alternatively, the tuner modules can be fabricated on a common printed circuit board, e.g. the chassis board 452. The module card includes a face plate 456 attached at an end of the chassis board, which supports the external connectors for the tuner module card. For example, the external connectors may include coaxial RF connectors 54, 54A, 56, 56A for the exemplary tuner configuration illustrated in FIG. 3. The face plate can also support external connectors for externally supplied control signals, e.g. trigger signals for external triggering.

An edge connector 454 extends from the back edge of the chassis board 452 and is configured for connection to a corresponding connector on the PXI chassis backplane board, in a conventional manner. A backplane contains multiple PXI controller and peripheral slots, which provides triggers, clock signals, communication and control of each of the PXI modules.

The backplane board is configured to provide control signals and dc power to the module card 450, including power and control signals to operate the solid state tuner module(s) of the tuner module card. Communication with the tuner module card 450 can be carried out through the backplane.

The external RF connectors on each tuner module card allow for readily cascading multiple tuner modules or tuner module cards, by use of short RF jumper cables. A common timing clock can be used for multiple cards. The modular format illustrated in FIGS. 16-18 provides advantages in cost and speed, in relation to use of separate external solid state tuners.

Other standardized architectures for modules could alternatively be used, for example, VME, VXI, PCI, PCI Express and PXI Express.

Although the foregoing has been a description and illustration of specific embodiments of the subject matter, various modifications and changes thereto can be made by persons skilled in the art without departing from the scope and spirit of the invention.

What is claimed is:

1. A solid state impedance tuner or impedance tuner system configured to present impedances to a device under test (DUT) and enable measurement of the DUT's performance as a function of such impedances in a measurement system, the impedance tuner or impedance tuner system comprising:
a housing structure;
at least two solid state tuner modules electrically combined and disposed within said housing structure, said at least two solid state modules cascaded in series connection;
wherein the at least two solid state modules cascaded in series connection are configured for connection to one port of the DUT so the at least two solid state modules present impedances only to the one port of the DUT; and
wherein each of said at least two tuner modules includes at least one solid state control element.

2. The solid state tuner or tuner system of claim 1, wherein each tuner module includes at least one control element array comprising a number N of solid state control elements.

3. The solid state impedance tuner or tuner system of claim 2, wherein each control element is configured to be turned on individually, and simultaneously with other control elements, to create a specific impedance with fixed magnitude and phase.

4. The solid state impedance tuner or tuner system of claim 1;
wherein a plurality of control elements are selectively turned on simultaneously to achieve the desired impedance state.

5. The solid state impedance tuner or tuner system of claim 1, wherein the tuner or tuner system is operable to independently control said impedances at two frequencies.

6. A solid state impedance tuner or impedance tuner system configured to present impedances to a device under test (DUT) and enable measurement of the DUT's performance as a function of such impedances in a measurement system, the impedance tuner or impedance tuner system comprising:
a housing structure;
at least two solid state tuner modules electrically combined and disposed within said housing structure, said at least two solid state modules cascaded in series connection;
wherein each of said at least two tuner modules includes at least one solid state control element; and
wherein each tuner module comprises at least two solid state control element arrays, and further comprising
a combiner circuit for electrically combining the at least two solid state tuner arrays;
a printed wiring board; and
wherein the combiner circuit and the at least two solid state tuner modules are constructed or mounted on the printed wiring board.

7. The solid state impedance tuner or tuner system of claim 6, wherein the control element arrays comprise discrete control element chips mounted to the printed wiring board.

8. A solid state impedance tuner system operable at RF frequencies to present impedances to a device under test (DUT) and enable measurement of the DUT's performance as a function of such impedances in a measurement system, comprising:
a housing structure;
the housing structure supporting first, second, third and fourth RF ports;
first and second solid state tuner modules disposed within said housing structure, each tuner module having a first module port and a second module port;
the first port of the first module connected to said first RF port, the second port of the first module connected to said second RF port, the first port of the second module connected to said third RF port, and the second port of the second module connected to said fourth RF port;
each of said tuner modules comprising a control element array configured to have a plurality of solid state control elements selectively turned on to achieve a desired impedance state;
the impedance tuner system configured to be a single tuner system by connection of the second and third RF ports by a jumper cable, wherein the first and fourth RF ports are single tuner system connection ports, or alternatively as an impedance tuner system comprising separate impedance tuners in which the first and second RF ports are connection ports to a first tuner and the third and fourth RF ports are connection ports to a second tuner.

9. The impedance tuner system of claim 8, wherein:
each tuner module comprising first and second control element arrays;
each control element array comprising N solid state control elements S1 . . . SN, arranged along an RF transmission line and separated from adjacent control elements by transmission line segments; and
each control element is controlled by a control line L1 . . . LN; and further comprising:
a controller configured to selectively turn on or off each control element by application of a control signal to the corresponding control line to vary an impedance presented by the control element array.

10. The impedance tuner system of claim 9;
wherein the controller is configured to selectively turn on a plurality of control elements simultaneously to achieve the desired impedance state.

11. The impedance tuner system of claim 10, wherein said plurality of control elements selectively turned on simultaneously are contiguous control elements.

12. The impedance tuner system of claim 8;
wherein the tuner system is operable to independently control said impedances at two frequencies.

13. A solid state impedance tuner system operable at RF frequencies to present impedances to a device under test (DUT) and enable measurement of the DUT's performance as a function of such impedances in a measurement system, comprising:
a housing structure;
first and second solid state tuner modules disposed within said housing structure;
wherein each of said first and second tuner modules includes at least one solid state control element;
the first and second solid state tuner modules electrically cascaded together in series;
a controller configured to selectively turn on or off each control element by application of a control signal to the corresponding control line to vary an impedance presented by the system;
wherein the first solid state tuner module has a number N1 of individual impedance states and the second solid state tuner module has a number N2 of individual impedance states, and wherein the cascaded first and second modules provide at least N1 times N2 impedance states and are configured for connection to one port of the DUT to present impedances only to the said one port of the DUT; and
wherein the tuner system is operable to independently control said impedance at two frequencies.

14. The tuner system of claim 13, wherein:
each tuner module comprising first and second control element arrays;
each control element array comprises N solid state control elements S1 . . . SN, arranged along an RF transmission line and separated from adjacent control elements by transmission line segments; and
each control element is controlled by a control line L1 . . . LN.

15. The tuner system of claim 14;
wherein the controller is configured to selectively turn on a plurality of control elements simultaneously to achieve a desired impedance.

* * * * *